(12) United States Patent
Spiteri et al.

(10) Patent No.: US 12,362,213 B2
(45) Date of Patent: Jul. 15, 2025

(54) TRAY CARRIER AND CORRESPONDING METHOD

(71) Applicant: STMicroelectronics (Malta) Ltd, Kirkop (MT)

(72) Inventors: Silvio Spiteri, Siggiewi (MT); Tiziana Borg, Rabat (MT); Alex Grima, Gozo (MT)

(73) Assignee: STMicroelectronics (Malta) Ltd, Kirkop (MT)

( * ) Notice: Subject to any disclaimer, the term of this patent is extended or adjusted under 35 U.S.C. 154(b) by 150 days.

(21) Appl. No.: 17/993,369

(22) Filed: Nov. 23, 2022

(65) Prior Publication Data

US 2023/0170236 A1 Jun. 1, 2023

(30) Foreign Application Priority Data

Nov. 30, 2021 (IT) .......................... 102021000030233

(51) Int. Cl.
*H01L 21/673* (2006.01)
*G01R 31/28* (2006.01)
*H01L 21/677* (2006.01)

(52) U.S. Cl.
CPC .... *H01L 21/67333* (2013.01); *G01R 31/2893* (2013.01); *H01L 21/67712* (2013.01)

(58) Field of Classification Search
CPC ........ H01L 21/67333; H01L 21/67712; B65D 5/4608; B65D 5/445; B65D 5/321
USPC .................................. 206/429, 557, 558, 712
See application file for complete search history.

(56) References Cited

U.S. PATENT DOCUMENTS

| 6,131,730 A * | 10/2000 | Hsu ......................... B65D 1/22 206/427 |
| 2012/0273389 A1* | 11/2012 | Aziz .................. B65D 11/1833 414/800 |
| 2014/0231299 A1* | 8/2014 | Hassell .................... B65D 1/34 206/509 |

(Continued)

FOREIGN PATENT DOCUMENTS

CN 215664511 * 8/2021 ............. B65D 19/38

OTHER PUBLICATIONS

Ids (Year: 2021).*
IT Search Report and Written Opinion for priority application, IT Appl. 102021000030233, report dated Jun. 21, 2022, 7 pgs.

*Primary Examiner* — Anthony D Stashick
*Assistant Examiner* — Raven Collins
(74) *Attorney, Agent, or Firm* — Crowe & Dunlevy LLC

(57) ABSTRACT

A tray carrier includes a base plate having a first and second pairs of opposed sides as well as opposed first and second surfaces. Channel-shaped corner members provide containment formations for trays stacked at the first surface of the base plate. Tray carrier gripping cavities provided in the first pair of opposed sides can be engaged by gripping formations of an automated gripper to facilitate gripping the tray carrier. Raised portions at the first surface of the base plate provide a tray-gripping space engaged by gripping formations of the automated gripper to facilitate gripping trays stacked at the first surface of the base plate. Handle members at the second sides of the base plate facilitate manual handling of the tray carrier, and a pair of opposed recesses in the first sides of the base plate provide a narrowed intermediate portion of the base plate for manual handling of trays.

7 Claims, 6 Drawing Sheets

(56) References Cited

U.S. PATENT DOCUMENTS

2015/0151875 A1* 6/2015 Hassell .................... B65D 1/34
206/557

* cited by examiner

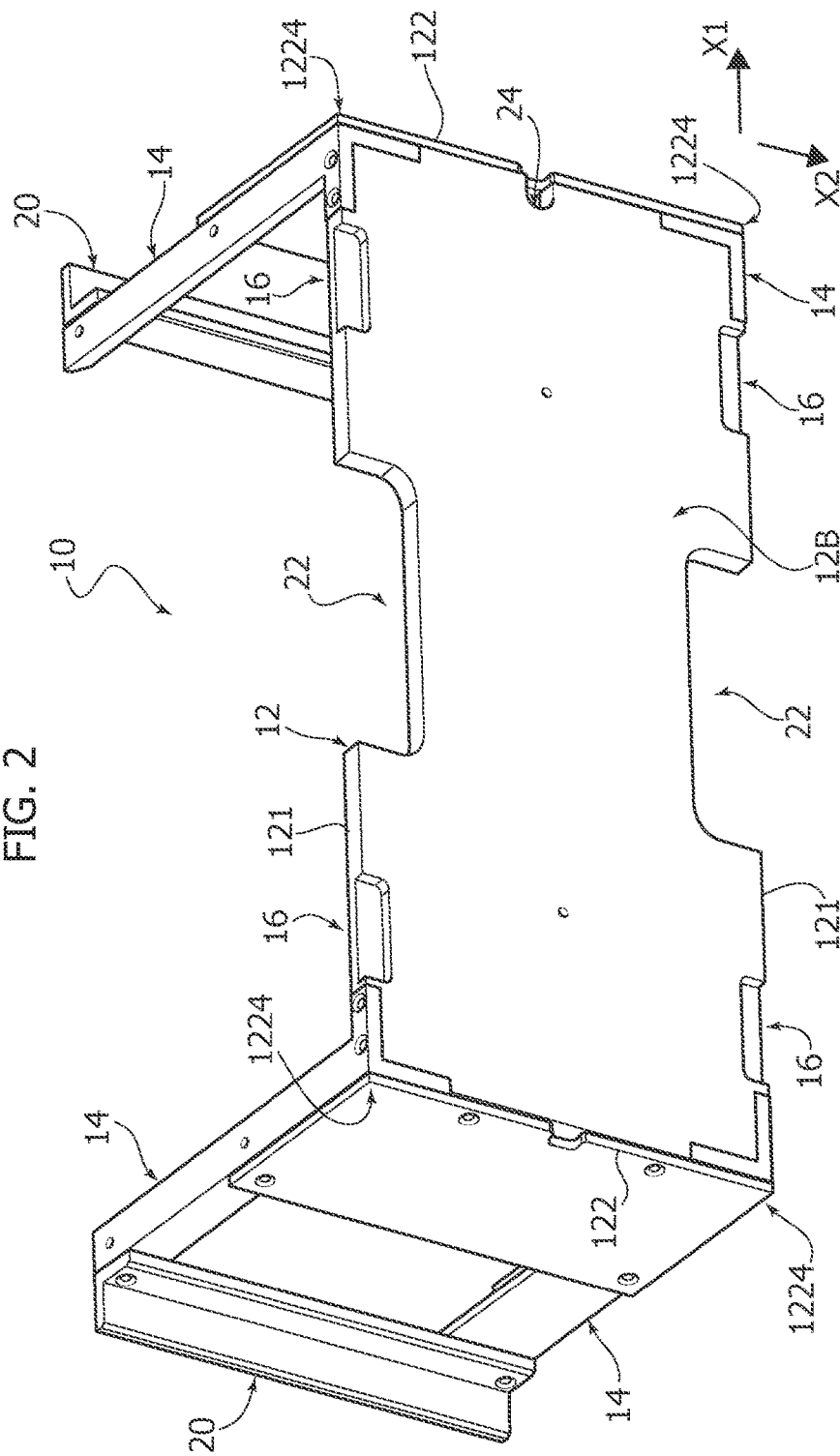
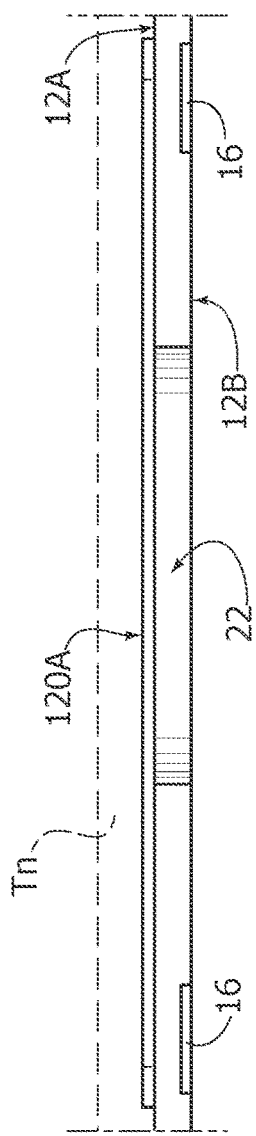
FIG. 2
FIG. 3

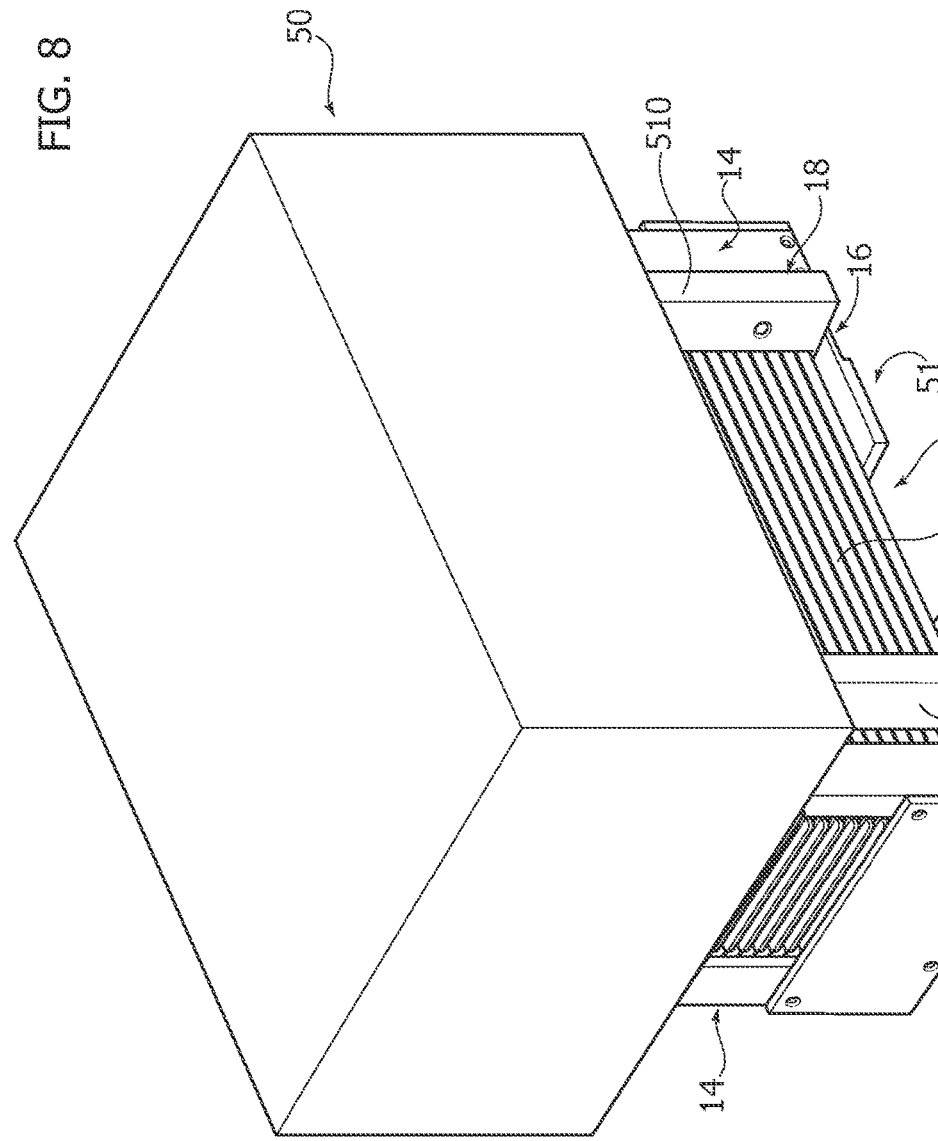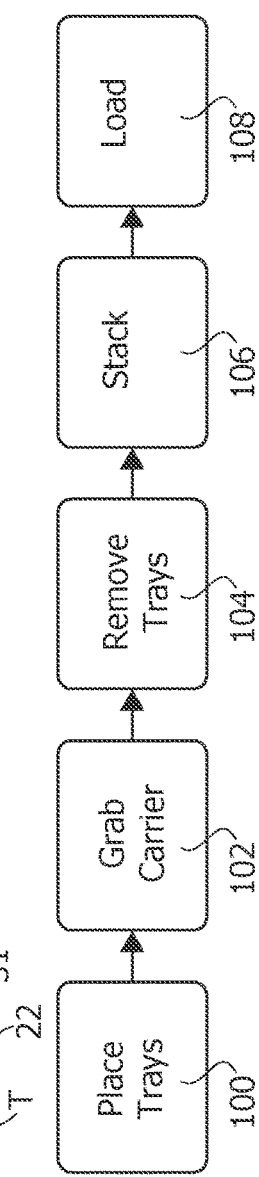

TRAY CARRIER AND CORRESPONDING METHOD

PRIORITY CLAIM

This application claims the priority benefit of Italian Application for Patent No. 102021000030233, filed on Nov. 30, 2021, the content of which is hereby incorporated by reference in its entirety to the maximum extent allowable by law.

TECHNICAL FIELD

The description relates to tray carriers.

One or more embodiments can be advantageously applied to handling integrated circuits (ICs).

BACKGROUND

A current solution adopted in the microelectronics industry for handling integrated circuits, modules and other components involves using so-called JEDEC matrix trays. JEDEC trays are constructed from plastics or other materials such as aluminum and are effective in holding and protecting their contents.

Trays such JEDEC trays can be stacked in bundles of trays secured together (for instance, via hook-and-loop straps—e.g., "Velcro" straps) to be manually handled by human operators: for instance, operators can manually feed tray bundles to test equipment handlers.

Tray cassettes, with slots for front-side tray insertion, can be used for tray handling. For example, see Chinese patent document CN 210140085 U which describes such a cassette used for storing ball grid array (BGA) substrates.

Such a solution is not exempt from drawbacks.

For instance, vibration during tray insertion may result in packages popping out of their slots.

Also, human manpower may still be intensively applied in loading trays (usually one-by-one, due to the difficulty in picking a whole tray bundle by hand within a cassette).

Being able to extend automated material handling systems (AMHS) as currently used with Front-end Application Bundles (FABs) to a Back-end and test environment would be desirable. Also, such an arrangement would be advantageous to be adopted by original equipment manufacturers (OEMs) of test equipment.

There is a need in the art to contribute in facilitating such an extension of automated material handling.

SUMMARY

One or more embodiments relate to a tray carrier.

One or more embodiments relate to a corresponding method of manipulating trays, e.g., via an automated (e.g., "robotized") gripper device configured to be used in co-operation with a tray carrier.

One or more embodiments provide a tray carrier which facilitates tray handling by automated (robotized) handling systems while retaining the possibility of handling by human operators.

In that respect it will be appreciated that, while handling trays holding semiconductor devices such as packaged dice will be referred throughout this description for simplicity, examples as discussed herein can be applied also in other sectors of industry.

The examples presented herein take into account various factors that come into play when automated handling of trays is considered.

For instance, un-strapping a bundle of trays and at the same time maintaining integrity of the tray bundle without causing physical damage to the bundle and devices within the bundle may be hardly feasible for an automated robotic vehicle.

On the other hand, moving around bundles of trays in a loose condition may be dangerous and/or involve drawbacks: for instance, loose bundles may be exposed to quality issues such as undesired mixing of bundles and products contained in the trays.

It is otherwise noted that, while facilitated automated handling is a desired result, various applications may benefit from retaining the capability of handling trays manually.

Examples as discussed herein thus provide a tray carrier that, on the one hand, is suited for automated handling of tray bundles (by automated robotic vehicles, for instance) and, on the other hand, retains the possibility of manual tray handling by a human operator.

Examples as discussed herein may incorporate features that facilitate a human operator in removing/placing tray bundles easily in a tray carrier and move the tray carrier around.

Examples as discussed herein may include quality features such as identification of the tray bundle and/or shape features that facilitate a correct orientation in loading trays in a bundle and/or in loading of a tray carrier (in an automated robotic vehicle, for instance).

Certain examples as discussed herein refer to the possibility for an automated gripper device to grab and move around a tray carrier with the capability for the gripper device (as carried, e.g., by as automated robotic vehicle) to remove/place tray bundles easily and safely.

In certain examples, tray bundles are fully traceable via an identifier of a tray carrier, which facilitates paperless and safer manipulation via automated vehicles. For instance, a user reading a tracker identifier can be made aware of the nature and type of a tray bundle and/or of a process step currently performed thereon.

BRIEF DESCRIPTION OF THE DRAWINGS

One or more embodiments will now be described, by way of example only, with reference to the annexed figures, wherein:

FIG. 2 is a perspective view of the tray carrier of FIG. 1 observed from a different viewpoint, FIG. 3 is a partial side view along line III-III of FIG. 1, FIGS. 4 and 5 are perspective views of exemplary automated gripper devices that may be used in co-operation with embodiments of the present description, FIG. 9 is a flowchart exemplary of steps in a process according to embodiments of the present description.

DETAILED DESCRIPTION

Figure 1:
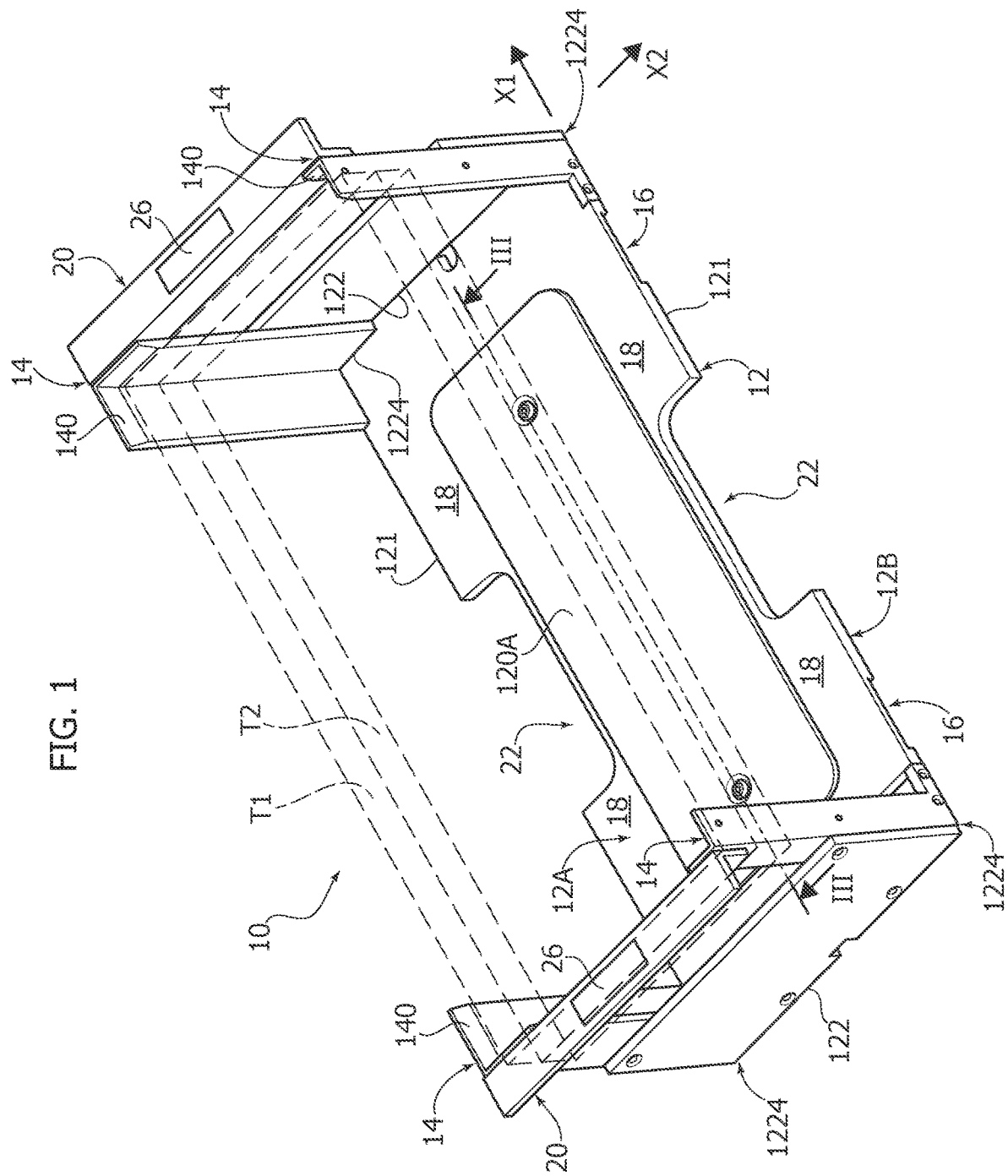
FIG. 1 is a perspective view of a tray carrier according to embodiments of the present description.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

A conventional way of moving around tray bundles in industry (in the semiconductor industry, for instance) involves forming bundles of trays held together with straps such as hook-and-loop straps (so-called, "Velcro" straps).

This is a relatively convenient way of manually handling tray bundles in small lots as is the case, for instance, of so-called JEDEC trays, holding packaged dice.

It is otherwise once more recalled that referring throughout this description to handling trays holding semiconductor devices such as packaged dice is merely for simplicity: examples as discussed are not limited to that possible area of use.

Various embodiments can in fact be applied also in other sectors of industry where trays are intended to be handled by or on automated robotic vehicles, e.g., using tray carriers that can be advantageously provided to carry a respective identifier (ID).

Throughout the figures, reference 10 denotes a tray carrier intended to be used to carry a stack of trays T formed therein (trays in such a stack are also indicated as T1, T2 or Tn in the figures).

So-called JETEC trays as used for holding packaged dice in the semiconductor (microelectronics) industry may be exemplary of such trays: once again, it is recalled that the embodiments are not limited to such types of trays and such possible field of use.

As exemplified in the figures, the tray carrier 10 comprises a (quadrangular, e.g., substantially rectangular) base plate 12 having a first pair of opposed sides 121 extending in a first direction X1 and a second pair of opposed sides 122 extending in a second direction X2 transverse (e.g., perpendicular) to the first direction X1.

As illustrated, the base plate 12 has four corners 1224 at the intersections of the first pair of (here longer) sides 121 and the second pair of (here shorter) sides 122.

Also, as illustrated, the base plate 12 has a first, front or top, surface 12A (onto which trays T are stacked) and a second, back or bottom, surface 12B opposed the first surface 12A.

As illustrated, the tray carrier 10 comprises four channel-shaped (e.g., L-shaped) corner members 14 that stand up (that is, emerge) from the first surface 12A of the base plate 12, e.g., orthogonal to the base plate 12.

Each corner member 14 is arranged at one of the corners 1224 of the base plate 12 with the channel-shape thereof facing (that is, opening towards) the base plate 12.

The channel shape of the corner members 14 facilitates such corner members 14 in providing (angular) containment formations for trays T stacked at the first surface 12A of the base plate. Two such trays located at the top of the stack and designated T1, T2 are illustrated in dashed outline in FIG. 1.

Reference 16 denotes a set of, e.g., four tray carrier gripping cavities provided (as step-like recesses formed in the second surface 12B, for instance) at the first pair of opposed sides 121 of the base plate 12.

As discussed in the following, the tray carrier gripping cavities 16 are configured to be engaged (penetrated) by gripping formations of a gripper device.

The tray carrier 10 (and, possibly a stack of trays T stacked therein) can thus be gripped and possibly lifted and/or carried by an automated handling system such as an automated robotic vehicle.

As visible in FIG. 1 (and in the lateral view of FIG. 3), the first surface 12A of the base plate 12 comprises a raised portion 120A.

As illustrated herein, the (here, central and substantially quadrangular) raised portion 120A is distanced from both the first pair 121 and the second pair 122 of opposed sides of the base plate.

It is noted that such a "mesa-like" implementation of the raised portion 120A is merely exemplary.

For instance, in other possible examples, plural raised portions 120A can be provided, e.g., in the form of a pair of raised bands extending substantially along the direction X2 from one to another of opposed sides 121.

Whatever the specific implementation, the raised portion(s) 120A is/are sized and dimensioned in such a way that a stack of trays stacked at the first surface 12A of the base plate 12 will protrude sidewise of the raised portion(s) 120A (see, e.g., the tray Tn whose outline is shown in dashed line in FIG. 3) and form at the periphery of the first (top or front) surface 12A of the base plate 12 a tray-gripping space 18 between the surface 12A and the stack of trays T.

This space will be suited to be engaged (penetrated) by gripping formations of a gripper device as discussed in the following.

In that way, for instance, a stack of trays T formed at the first surface 12A of the base plate 12 can be gripped—without—such gripping action involving the base plate 12 and thus the tray carrier 10.

By penetrating into the areas designated 18 in FIG. 1, such gripping formations can thus "sneak" between the base plate 12 and the stack of trays T formed at the front surface 12A thereof with the capability of gripping (only) the stack of trays T, which can thus be lifted and unloaded from the tray carrier 10.

An advantageous feature of examples presented herein lies in the capability of associating automated gripping features (of the tray carrier 10 with trays T possibly stacked thereon—or—the trays only) as discussed previously with manual handling features of the trays.

As visible in the figures, a pair of handle members 20 are provided extending bridge-like between the distal ends of two corner members 14 at the opposed ends of the sides 122.

The handle members 20 are thus configured to facilitate manual handling of the tray carrier 10 (empty or having trays T stacked therein).

Also, a pair of opposed recesses 22 are provided in the first pair of opposed sides 121 of the base plate 12. The recesses 22 jointly define a narrowed waist-like intermediate portion of the base plate 12. This facilitates manual handling (lifting, for instance) of trays T stacked onto the first surface 12A of the base plate 12 with the capability of gripping (only) these trays T, which can thus be lifted and unloaded from the tray carrier 10.

As illustrated herein, a pair of (step-like) tray carrier gripping cavities 16 are provided flanking a (central) recess 22 at each one of the first sides 121 of the base plate 12.

Various advantageous features of the tray carrier 10 facilitate stacking of trays T (performed via automated equipment or manually).

For instance, the distal ends of the corner members 14 opposite the surface 12A of the base plate 12 may exhibit a terminal chamfer 140. This chamfer 140 facilitates lead-in of the trays T into the tray carrier 10.

Also, the corner members 14 may have different (asymmetric) shapes (for instance, with the corner members 14 at one of the sides 121 smaller and/or thinner than the corner members at the opposite side 121) so that the trays can be loaded into the tray carrier 10 only with a certain, desired orientation and preventing stacking in the tray carrier 10 trays T with an undesired 180° rotation in the plane of the tray.

Additional advantageous features of the tray carrier 10 may include one or more formations 24 such as (possibly asymmetric) notches preventing undesirable positioning of the tray carrier 10 with an undesired (e.g., 180° rotated) mounting location.

Further advantageous features may include code-carrying surfaces 26 configured for application of a unique identifier (ID) of a certain tray carrier 10 (and the contents thereof).

As illustrated, features such as the anti-tray rotation feature 24 and the code-carrying surfaces can be provided at one or both of the second (here shorter) sides 122 of the base plate.

This feature can be only on one side of the base of the tray carrier. To reduce manufacturing cost, a side plate with a notch is used on both sides of the tray carrier.

Reference numeral 50 in FIGS. 4 to 8 denote automated gripper devices configured to be used in co-operation with a tray carrier 10 as discussed in the foregoing.

Referring to grippers in the plural intends to highlight the fact that different gripper devices can be used during different tray handling steps as discussed in the following (e.g., in connection with FIG. 9).

As illustrated, the gripper devices 50 (that may be of any type known to those of skill in the art for that purpose) comprise a pair of mutually-opposed, e.g., fork-shaped gripping members 51, 52.

The one and the other of the fork-shaped gripping members 51 and 52 in the pair include prongs 510 (first gripping member 51) and 520 (second gripping member 52) having distal gripping formations 511, 521.

As illustrated, the distal gripping formations 511 in one of the gripping members (for instance, in the gripping member 51) point towards homologous distal gripping formation 521 in the other gripping member in the pair (for instance, in the gripping member 52).

Figure 5:
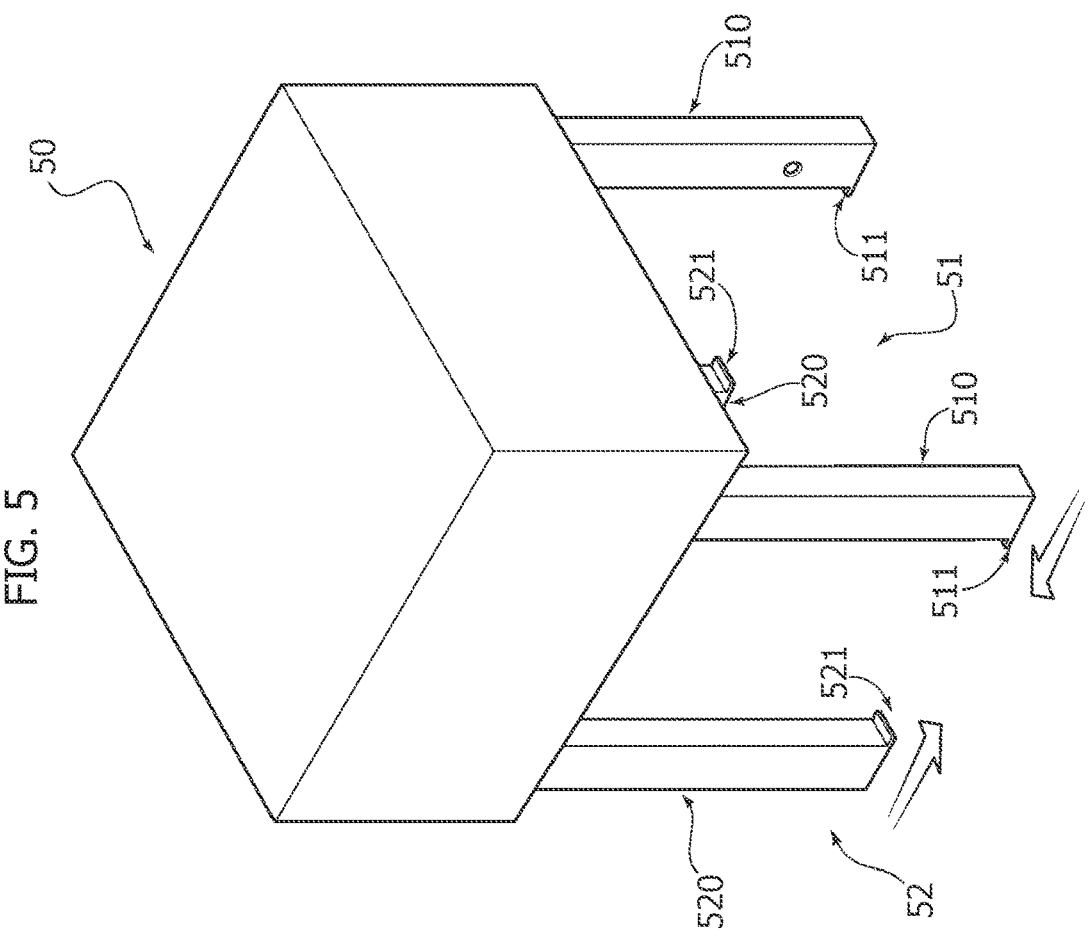
Figure 4:
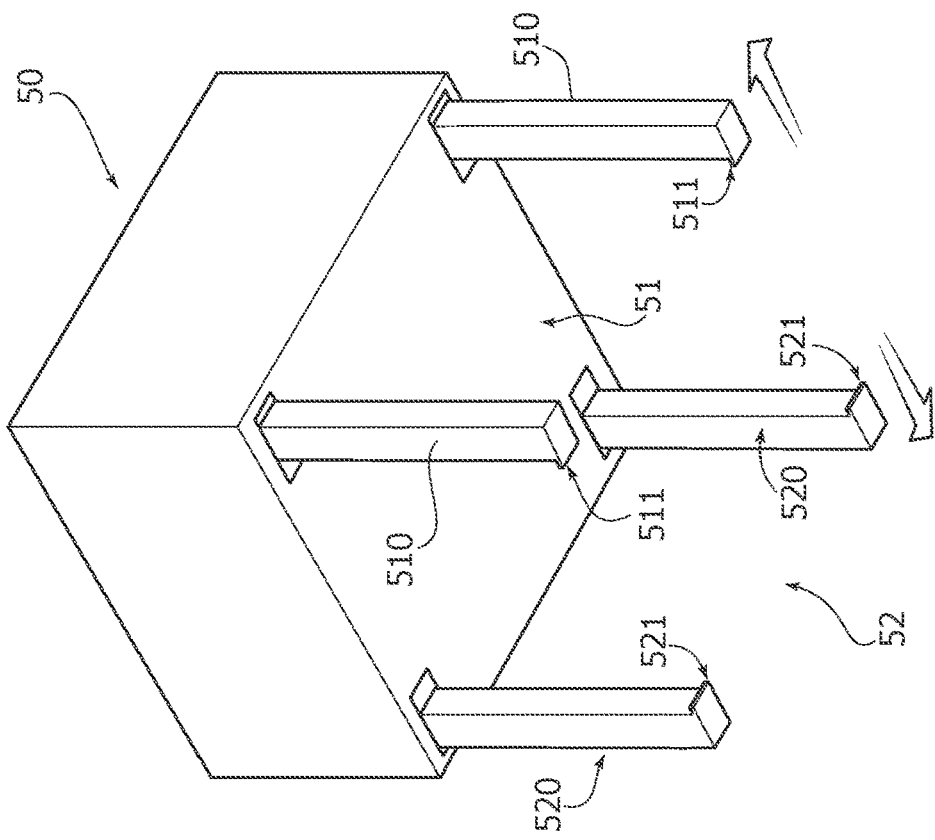
Figure 6A:
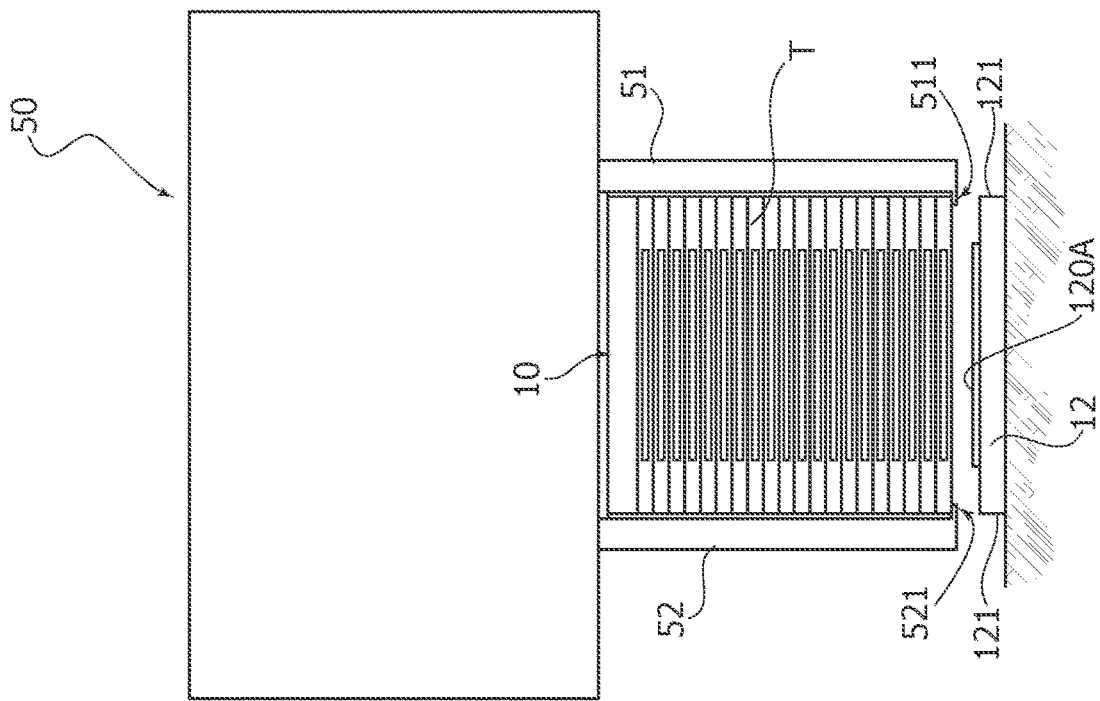
FIGS. 6A and 6B are exemplary of operation of a gripper device as illustrated in FIGS. 4 and 5, FIGS. 7 and 8 are further exemplary of operation of gripper devices as illustrated in FIGS. 4 and 5.
Figure 6B:
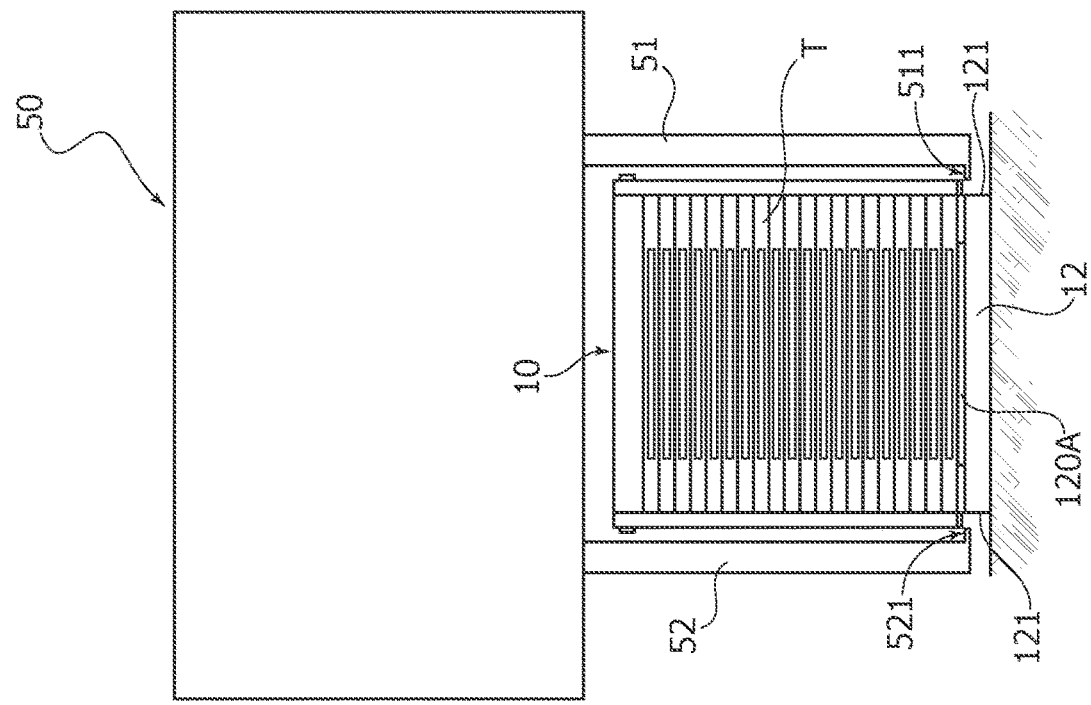

As illustrated in FIGS. 4 and 5 (and in a manner known per se to those of skill in the art), the gripping head carrying the gripping members 51 and 52 includes a motorization (an electric motor with an associated reduction gear, for instance) that is selectively activatable to provide relative movement of the fork-shaped members 51 and 52 towards and away from each other.

Such relative movement can take place between:
- a first, spaced-apart condition (see for instance FIG. 6A) wherein the gripper device is arranged astride the tray carrier 10 with the distal gripping formation 511, 521 in the prongs of the fork-shaped gripping members 51, 52, kept clear of the first pair of opposed sides of the base plate 12 of the tray carrier 10), and
- a second, gripping condition wherein, in response to the mutually opposed fork-shaped gripping members 51, 52 being advanced towards each other (in the direction indicated X2 in FIGS. 1 and 2), the distal gripping formations 511, 521 of the prongs of the fork-shaped gripping members 51, 52 act—depending on the relative vertical position of gripper device 50 with respect to the tray carrier 10—in two different possible gripping condition.

In a first gripping condition (illustrated in FIG. 7), the gripping formations 511, 521 engage the (e.g., step-like) tray carrier gripping cavities 16 provided in the base plate 12. In that way, the fork members 51 and 52 grip (at the base plate 12, for instance at the underside 12B thereof) the tray carrier 10 possibly having a stack of trays formed thereon: a lowest tray (designated Tn) in the stack is visible in FIG. 7 while the outline of the whole stack (designated T) is shown in dashed line.

In that way, the gripper device is capable of manipulating the tray carrier 10 and (possibly) the trays T stacked thereon.

In a second gripping condition (illustrated in FIG. 8), the gripping formations 511, 521 engage (penetrate) into the tray-gripping space 18 provided around the raised portion 120A of the first surface 12A of the base plate 12, thus gripping (only) the trays T stacked onto the first surface 12A of the base plate 12.

In that way, the gripper device is capable of manipulating (only) the trays T stacked in the tray carrier 10, with, e.g., the possibility of lifting the stacked trays T with respect to the base plate 12 thus unloading the tray carrier 10.

While not visible in the figures for simplicity, the gripper devices 50 can be configured—in a manner known per se to those of skill in the art—in such a way to effect, in addition to the relative forward (gripping) and backward (ungripping) movement of the fork-like members 51 and 52, also an adjustment movement of the distance between the prongs (and thus between the gripping formations 511, 521) in each one of the fork members 51 and 52.

This opening-closing movement may facilitate, for instance, adjusting the distance between the gripping formations 511, 521 in the fork members 51 and 52 to match exactly the distance between the tray carrier gripping cavities 16 provided in the base plate 12.

The flowchart of FIG. 9 is exemplary of a possible sequence of using a tray carrier as discussed herein.

In the flowchart of FIG. 9, the block 100 is exemplary of the step of placing a bundle of trays T in a tray carrier such as 10.

Such step can be performed either manually by an operator or via an automated device such as an automated gripper device.

Figure 7:
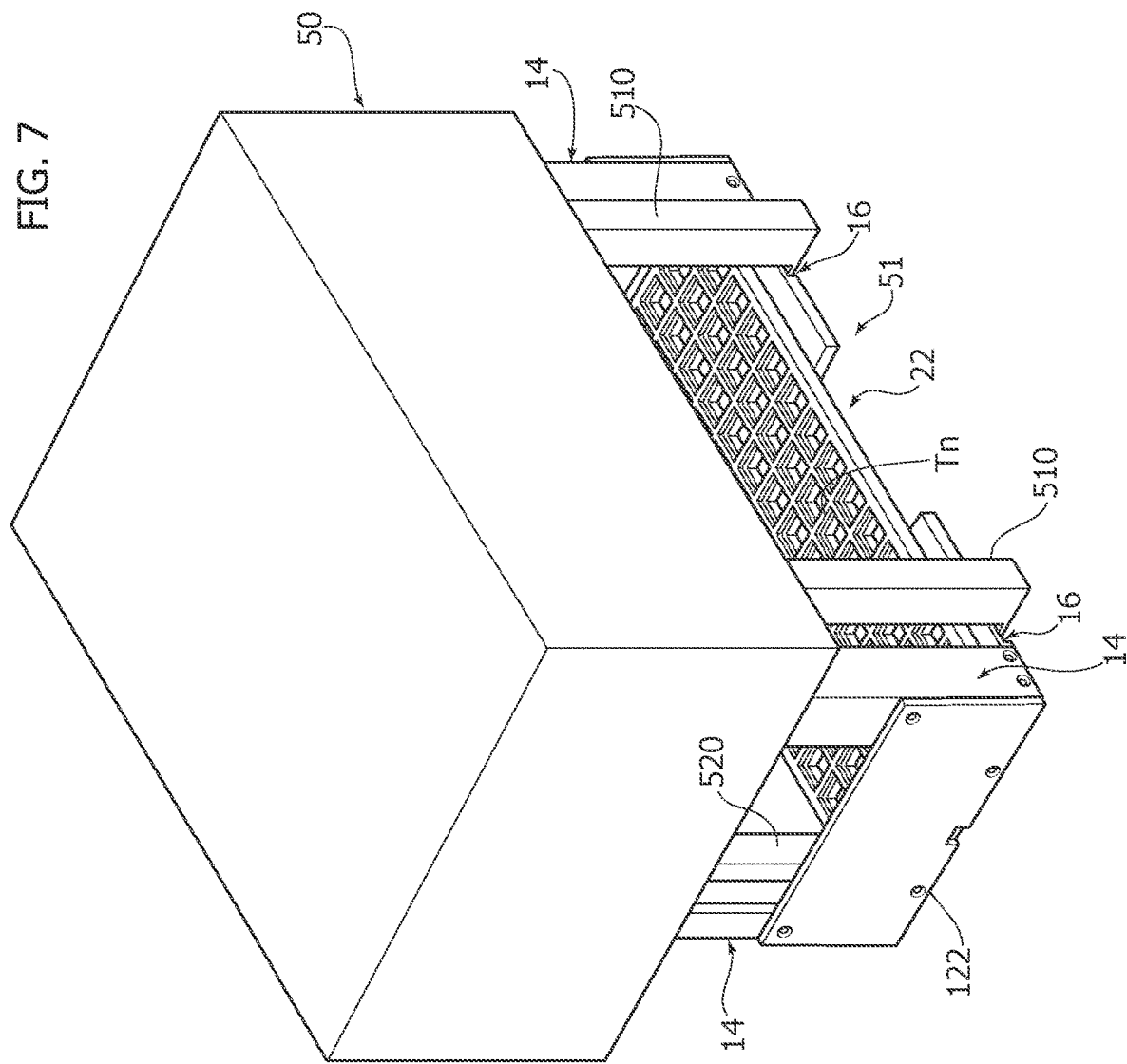

The block 102 is exemplary of the tray carrier 10 thus loaded with a stack of trays being grabbed via an automated gripper device such as 50 that acts on the tray carrier 10 and the trays stacked therein essentially as exemplified in FIG. 7, namely with the gripping formations 511, 521 of the fork-shaped members 51, 52 engaging the (e.g., step-like) tray carrier gripping cavities 16 at the (under)sides 121 of the base plate 12.

The tray carrier 10 loaded with trays can thus be carried (with an automated robotic vehicle, for instance) to a processing equipment (for testing purposes, for instance).

An automated robotic vehicle (same or different from the previous one) can then remove the bundle of trays T from the tray carrier 10 acting, for instance, as exemplified in FIG. 8, namely with the gripping formations 511, 521 of the gripping members 51, 52 penetrating into the space 18 between the base plate 12 and stack of trays T as provided by the raised portion 120A of the first surface 12A of the base portion 12.

Such a step is exemplified by the block 104 in the flowchart of FIG. 9.

Instructions can be sent to an automated robotic vehicle to fetch the "processed" bundles and load them into (another) processing device, e.g., by stacking them into a tray carrier such as 10 (block 106 in FIG. 9) and then load them (block 108 in FIG. 9) into another processing equipment in a fully automated manner.

Such a sequence of steps is of course merely exemplary of a wide gamut of possible handling sequences that take advantage of the possibility, as offered by the examples presented herein, of handling—automatically, and possibly manually—either a tray carrier such as 10 (either empty of having trays therein) or just a stack of trays, e.g., for loading or unloading a tray carrier such as the tray carrier 10.

Without prejudice to the underlying principles, the details and embodiments may vary, even significantly, with respect to what has been described by way of example only, without departing from the extent of protection.

The claims are an integral part of the technical teaching provided herein in connection with the embodiments.

The extent of protection is defined by the annexed claims.

The invention claimed is:

1. A method, comprising:
    loading a stack of trays in a tray carrier, wherein said tray carrier comprises:
        a base plate having a first pair of opposed sides extending in a first direction, a second pair of opposed sides extending in a second direction transverse to the first direction and four corners, wherein the base plate has a lower surface and an upper surface opposed the lower surface;
        corner members configured to provide a containment formation for said stack of trays;
        at least one raised portion of the upper surface of the base plate configured to provide a tray-gripping space at said first pair of opposed sides of the base plate between the upper surface of the base plate and an under surface of said stack of trays; and
        tray carrier gripping cavities in the lower surface of the base plate at said first pair of opposed sides
    gripping the tray carrier with the stack of trays loaded therein via gripping formations of an automated gripper device which engage the tray carrier gripping cavities in said first pair of opposed sides of the base plate; and
    unloading the stack of trays from the tray carrier via said gripping formations of said automated gripper device which engage said tray-gripping space, provided by the at least one raised portion, between the upper surface of the base plate and the under surface of said stack of trays.

2. The method of claim 1, wherein the tray carrier has at least one code-carrying surface.

3. The method of claim 2, wherein the at least one code-carrying surface is arranged associated with at least one side in the second pair of opposed sides of the base plate.

4. The method of claim 1, wherein the tray carrier comprises a pair of handle members extending in said second direction transverse to the first direction, further comprising manually handling the tray carrier using the pair of handle members.

5. The method of claim 4, wherein each handle member extends bridge-like between distal ends of two of said channel-shaped corner members.

6. The method of claim 1, further comprising a pair of opposed recesses in the first pair of opposed sides of the base plate, the pair of opposed recesses providing a narrowed intermediate portion of the base plate, the method further comprising manual handling of trays stacked at the first surface of the base plate using the pair of opposed recesses.

7. The method of claim 6, wherein the tray carrier gripping cavities comprise, at said first pair of opposed sides, a pair of tray carrier gripping cavities flanking each recess of said pair of opposed recesses.

* * * * *